United States Patent
Batterson et al.

(10) Patent No.: US 6,259,164 B1
(45) Date of Patent: Jul. 10, 2001

(54) OFFSET ALIGNMENT MARKS METHOD AND APPARATUS

(75) Inventors: Robert R. Batterson, Manassas, VA (US); Katherine Cecelia Norris, Milton; Paul David Sonntag, Colchester, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/283,992

(22) Filed: Apr. 1, 1999

Related U.S. Application Data

(62) Division of application No. 08/882,720, filed on Jun. 25, 1997, now Pat. No. 5,943,587.

(51) Int. Cl.[7] .............................................. H01L 23/544
(52) U.S. Cl. .................... 257/797; 438/401; 438/462; 438/975
(58) Field of Search ........................... 257/797; 438/401, 438/462, 975

(56) References Cited

U.S. PATENT DOCUMENTS

| | | | |
|---|---|---|---|
| 4,423,959 | 1/1984 | Nakazawa et al. | 356/400 |
| 4,981,529 | * 1/1991 | Tsujita | 148/33 |
| 5,106,432 | 4/1992 | Matsumoto et al. | 148/33.2 |
| 5,496,777 | 3/1996 | Moriyama | 437/249 |
| 5,777,392 | * 7/1998 | Fujii | 257/797 |
| 5,786,114 | * 7/1998 | Hashimoto | 430/5 |
| 5,917,205 | * 6/1999 | Mitsui et al. | 257/202 |

FOREIGN PATENT DOCUMENTS 61-141137    6/1986   (JP) .

* cited by examiner

*Primary Examiner*—Eddie Lee
*Assistant Examiner*—Allan R. Wilson
(74) *Attorney, Agent, or Firm*—Mark F. Chadurjian

(57) ABSTRACT

Offset alignment marks and a method of forming offset alignment marks within a kerf region of a semiconductor wafer in the manufacture of semiconductor devices includes the steps of forming a first track of a kerf and forming a second track of the kerf. The first track includes at least one alignment mark region having a first alignment mark disposed therein for use in an alignment of a first field of a first semiconductor chip active area. The second track includes at least one alignment mark region having a second alignment mark disposed therein for use in an alignment of a second field of a second semiconductor chip active area. The alignment mark regions of the first track and the second track are complementary and interlocking alignment mark regions extending across a centerline of the kerf and arranged in an offset manner with respect to one another along the kerf.

12 Claims, 3 Drawing Sheets

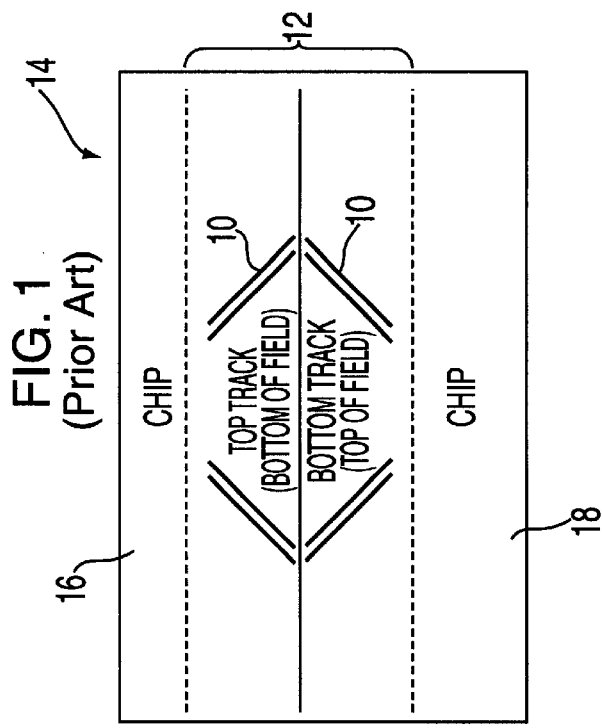
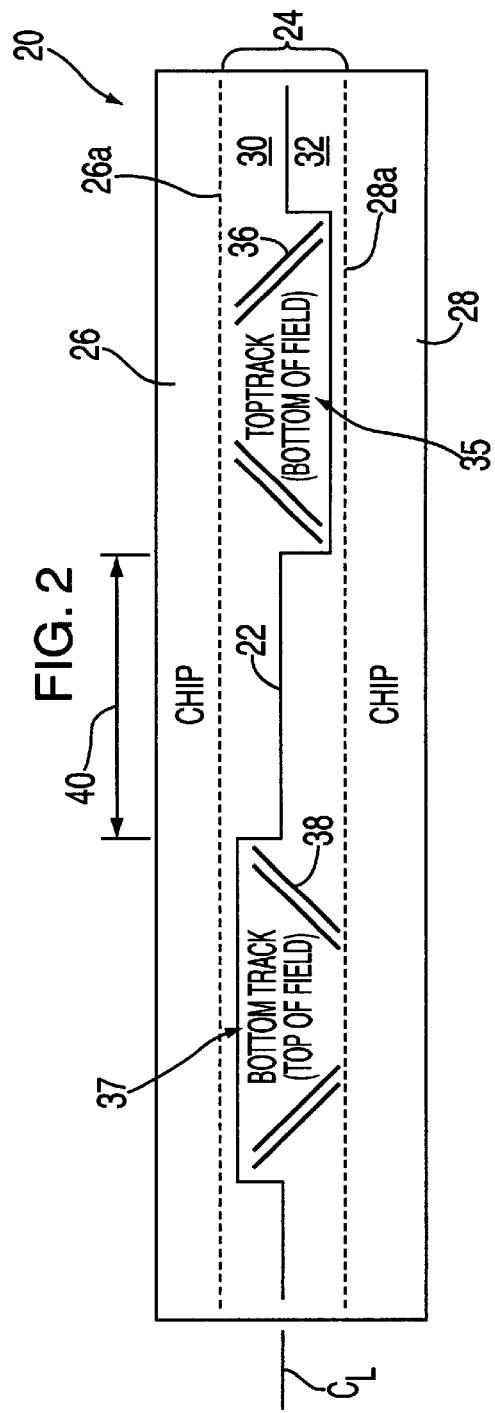

OFFSET ALIGNMENT MARKS METHOD AND APPARATUS

CROSS REFERENCE TO RELATED APPLICATION

This application is a divisional of application Ser. No. 08/882,720 filed Jun. 25, 1997 now U.S. Pat. No. 5,943,587.

BACKGROUND OF THE INVENTION

1. Field of the Invention

This invention relates generally to a method and apparatus for arranging alignment marks for use in a manufacturing process of a semiconductor device, and more particularly, for use in aligning to alignment marks on a wafer of the semiconductor device.

2. Discussion of the Related Art

There are many processes which require alignment to alignment marks on a wafer in the manufacturing of a semiconductor device. For example, in the case of forming a film on the wafer and then forming a given pattern on the thus formed film, a reticle (having an original image of a pattern,) and the wafer are accurately aligned with each other, and thereafter the image or pattern on the reticle is exposed on the film. Such an alignment is performed by aligning an alignment mark on the reticle with an alignment mark on the wafer.

When semiconductor devices are fabricated or put down on a wafer, the semiconductor devices are formed in regions called active areas of the wafer. The active areas of the wafer contain the semiconductor devices being manufactured. After formation, the semiconductor chips are individually cut apart with a cutting device. The cutting device has a finite cutting width. Such a device, in standard practice, includes for example, a diamond saw. To provide an adequate spacing for the cutting width between chips, an area is put in between all of the active areas on the wafer. Such an area is referred to as the kerf. The way in which a wafer is typically designed is that there is some portion of the kerf region remaining on the top, bottom, left and right side edges of the semiconductor chip subsequent to the chip being diced (i.e., when the individual chip has been diced from the wafer).

Typical practice includes designing the kerf so that some portion of the kerf is at the top, bottom, left and right of an active area. Measurement marks and alignment marks are typically placed in the top, bottom, left-hand and right-hand side kerf areas for use by measurement and alignment tools during manufacturing of the semiconductor devices on the wafer. The measurement marks and alignment marks are typically formed on the wafer during a manufacture thereof. The specific type and number of alignment marks depends upon the particular alignment tool being used. For example, there may be as few as two alignment marks, up to a family of marks. As mentioned, the specific type and number varies from alignment tool to alignment tool. For example, SVGL Micrascan is a particular type of alignment tool and Axiom is a particular alignment system.

In the manufacture of semiconductor devices, an alignment system is used in conjunction with a lithography tool. At a first level, a reference pattern is put down on a blank wafer. The alignment tool and lithography tool utilize the reference pattern in connection with patterning of subsequent layers. That is, the alignment system is used to align the lithography tool for the patterning of subsequent layers. The alignment tool makes reference to the alignment marks put down on a previous level, for aligning the lithography tool in conjunction with a present level.

There are a variety of different kinds of designs for individual alignment marks. For example, the alignment marks may include squares arranged in a grating. Similarly, the alignment marks may include a phase grating or series of lines. An alignment tool generally has optics and an encoder, wherein the alignment tool registers to (and locates based upon) what it sees in effect when viewing the alignment marks.

Referring to FIG. 1, such an alignment mark 10 is frequently formed within a kerf 12 on a wafer 14, the kerf 12 being a region between adjacent semiconductor chips 16, 18 on the wafer 14 defining the dicing channel between chips 16, 18. The dicing channel typically has a width on the order of less than the width of the kerf 12.

Alignment marks, as currently designed and known in the art, are limited by an amount of signal (i.e., signal characteristic) required for correctly processing a mark location with a particular alignment system. For example, with a commercially available Micrascan optical alignment system, chevrons (as shown in FIG. 1) can be no less than fifty-five microns (55 $\mu$m) in length versus a manufacturer's recommended value of seventy microns (70 $\mu$m). According to the Micrascan manufacturer, 70 $\mu$m is the point at which the signal level of a detected chevron begins to diminish. Chevrons are alignment marks for use with alignment systems. Chevrons typically include a pattern having the shape of a V or an inverted V. As such, the kerf must be at least 110 microns in width to accommodate both alignment marks.

In general, alignment marks are the largest structures in the kerf 12. Historically, the alignment mark has not been a limiter to manufacturing productivity because of the width of the dicing channel. The dicing channel width has typically been on the order of 135 micrometers ($\mu$m). The width of the dicing channel has also typically been determined as a function of the cutting or dicing tool cutting capability, that is, as dictated by an ability of the cutting tool to cut within a certain thickness channel, which is a combination of dicing saw width plus an allowance for local saw damage. With advancements in semiconductor manufacturing technology, new narrower dicing saws (developed for use with backside thinned semiconductor wafers) allow for much smaller dicing channels having widths on the order of 80 micrometers ($\mu$m). As a result, the productivity of the wafer is thus disadvantageously limited by the size of an alignment mark, because in order to fit both alignment marks the kerf width must be at least 110 microns.

In U.S. Pat. No. 5,496,777, entitled "Method of Arranging Alignment Marks," issued to Moriyama on Mar. 5, 1996, alignment marks are placed in contact with a scribing line. The alignment marks of the '777 patent furthermore extend into the active area of a semiconductor chip. The method of arranging alignment marks according to the '777 patent thus undesirably consumes valuable semiconductor real estate and the active area of the semiconductor wafer is not maximized. In addition, the kerf width L1 of the semiconductor wafer shown in the '777 patent is not made any smaller by the use of the alignment marks as taught therein.

It would thus be desirable to make alignment marks that fit within a narrower dicing channel to allow for a significant productivity improvement, without reducing alignment mark size.

SUMMARY OF THE INVENTION

It is an object of the present invention to provide a method of arranging alignment marks to minimize a width of a kerf which includes a dicing channel, even if large alignment marks are provided within the dicing channel.

Another object of the present invention is to provide a reduced kerf width between adjacent semiconductor chips on a wafer, thus enabling an increased number of chips on the wafer.

An Another object of the present invention is to provide for an improved alignment system throughput, wherein a productivity of the alignment system, in terms of wafers/hour, is increased.

In accordance with the present invention, offset alignment marks and a method of forming offset alignment marks within a kerf region of a semiconductor wafer in the manufacture of semiconductor devices includes the steps of forming a first track of a kerf and forming a second track of the kerf. The first track includes at least one alignment mark region having a first alignment mark disposed therein for use in an alignment of a first field of a first semiconductor chip active area. The second track includes at least one alignment mark region having a second alignment mark disposed therein for use in an alignment of a second field of a second semiconductor chip active area. The alignment mark regions of the first track and the second track are complementary and interlocking alignment mark regions extending across a centerline of the kerf and arranged in an offset manner with respect to one another along the kerf.

In one embodiment, the first track corresponds to a top track of a horizontal kerf and the first field corresponds to a bottom of field of the first semiconductor chip active area. In addition, the second track corresponds to a bottom track of the horizontal kerf and the second field corresponds to a top of field of the second semiconductor chip active are.

In another embodiment, the first track corresponds to a left-hand track of a vertical kerf and the first field corresponds to a right of field of the first semiconductor chip active area. In addition, the second track corresponds to a right-hand track of the vertical kerf and the second field corresponds to a left of field of the second semiconductor chip active area.

In further accordance with the present invention, the alignment mark region of the first track includes a region which extends beyond the centerline of the kerf in a direction of the second semiconductor chip active area. In addition, the alignment mark region of the second track includes a region which extends beyond the centerline of the kerf in a direction of the first semiconductor chip active area. The alignment mark regions of the first track and the second track are arranged in an offset manner with respect to one another along the kerf by a desired spacing amount. In one embodiment, the alignment mark regions of the first track and the second track are arranged in an offset manner with respect to one another along the kerf in a direct side-by-side arrangement.

Still further, in one embodiment, the kerf includes a height dimension on the order of less than two times (<2×) a height dimension of a single alignment mark. Alternatively, the kerf includes a height dimension on the order of a height dimension of a single alignment mark. With respect to the latter, the alignment marks in the first track and the second track are aligned at a same level positioning within the kerf, further in a manner for enabling a scanning of the alignment marks in the first track and in the second track to occur in a single scan.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which:

FIG. 1 is a plan view illustrating a known method of arranging alignment marks;

FIG. 2 is a plan view illustrating an embodiment of the method of arranging alignment marks in accordance with the present invention;

DETAILED DESCRIPTION OF A PREFERRED EMBODIMENT OF THE INVENTION

Figure 3:
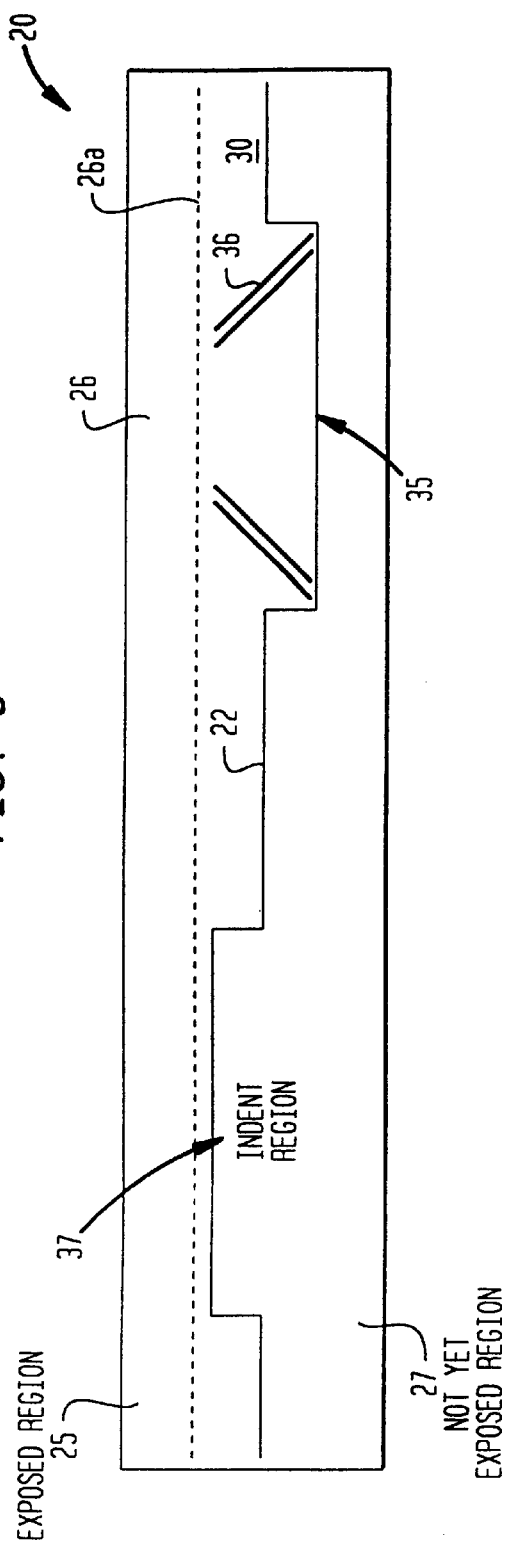
FIG. 3 is a plan view illustrating one step of the embodiment of the method of arranging alignment marks of FIG. 2.

In conjunction with the discussion to follow, the present invention is applicable to any type of alignment mark. The particular mark illustrated and discussed herein is particular to an SVG Lithography Micrascan tool, and is only exemplary. The present invention is not limited thereto.

Micrascan tools have two types of alignment systems. With respect to one of the alignment systems, the present invention provides the advantage of scanning once and getting twice as much information all at one time, as will be discussed further herein below. While the present discussion refers to the use of a Micrascan tool, the present invention and the advantage of size reduction as discussed herein with respect to the kerf applies with respect to all alignment systems.

Referring now to FIG. 2, a wafer 20 is shown with a solid line indicated by reference numeral 22 which refers to a boundary of a "field". The boundary line 22 is a reference line that represents a data boundary in the data used for defining the individual chips on a wafer. As such, each "chip" is made up of active chip area and kerf area prior to dicing and packaging. The dotted-line represents the boundary of an active area of a respective chip. The kerf 24 refers to the area between the active area boundaries of individual chips 26 and 28. The bottom boundary of the active area of chip 26 is indicated by reference numeral 26a. Similarly, a top boundary of the active area of chip 28 is indicated by reference numeral 28a.

In the kerf 24, an area extending from the edge of the active area 26a to the solid line 22 represents a bottom of field associated with the chip 26 at the top of FIG. 2. Similarly, the kerf area extending from the edge of the active area 28a to the solid line 22 represents a top of field associated with the chip 28 at the bottom of FIG. 2. Within the kerf area 24, there is also a top "track" 30 and a bottom track 32. The top track 30 is equivalent to the area of the kerf representing the bottom of the field associated with the top chip 26. The bottom "track" 32 is equivalent to the area of the kerf representing the top of the field associated with the bottom chip 28. The top track 30 and bottom track 32 abut together, the two tracks extending across the kerf between the active areas of adjacent chips 26 and 28 which are above and below one another, respectively. While the present invention is discussed herein with respect to a horizontal kerf region, the present invention is equally applicable with respect to a vertical kerf region between adjacent chips. The vertical kerf region includes, for example a left-hand track and a right-hand track, wherein a right of field of a first chip is equivalent to the left-hand track of the vertical kerf and a left of field of a second chip is equivalent to the right-hand track of the vertical kerf.

The manner in which the kerf 24 is formed is by butting two fields together (i.e., bottom of field and top of field). Generally, a portion of the kerf is associated with the top chip 26 (e.g., top track 30) and a portion of the kerf is associated with the bottom chip 28 (e.g., bottom track 32).

Figure 4:
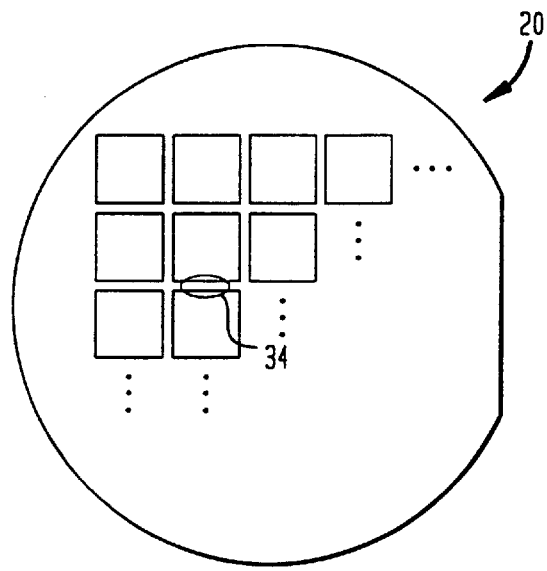
FIG. 4 illustrates a layout of semiconductor chips on a wafer.
Figure 5:
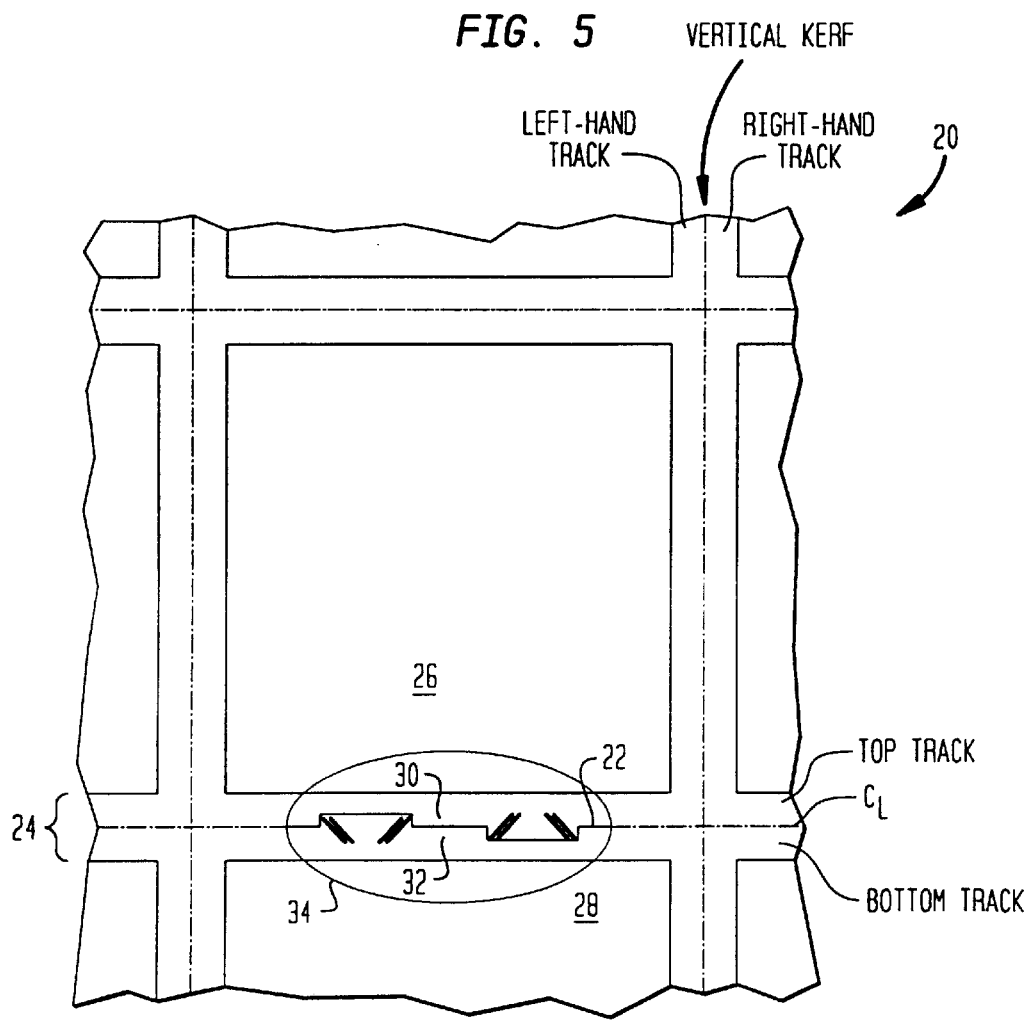
FIG. 5 is a plan view showing a part of a wafer on which semiconductor devices undergoing a manufacturing process are formed.

FIG. 4 illustrates a wafer having semiconductor chips thereon. From an exploded view of a portion 34 of FIG. 4, as shown in FIG. 5, there is a repetition of what is shown in FIG. 2 between adjacent active areas of individual chips. The kerf is replicated left, right, top, and bottom, about the active areas of the individual chips, all over the wafer 20. The wafer 20 includes an array of semiconductor chips, arranged in rows and columns. The boundary line 22 between an abutting top track 30 and bottom track 32 of the kerf 24, as shown in the figures, is shown for illustration purposes only. Once a top track 30 and a bottom track 32 are laid down, the boundary line 22 generally cannot be seen.

During the semiconductor manufacturing process, the wafer is exposed and patterned in a step-wise manner, one active area at a time. Exposing and patterning in the step-wise manner is typically carried out in rows and columns for the entire useful area of the wafer. For example, exposure can be conducted for all columns of chips of a first row, then all columns of a second row, etc. Thus in one exposure, an area 25 above the boundary line 22 (as shown in FIG. 3), is patterned as appropriate for a particular layer of chip 26, including an associated alignment mark 36 within top track 30. In a subsequent exposure at a later time, the area below the boundary line 22 (corresponding to a area 27 of FIG. 3 not yet exposed at the time of the exposure of area 25) is patterned as appropriate for a particular layer of chip 28 as shown in FIG. 2, including an associated alignment mark within bottom track 32 of kerf 24 as shown in FIG. 2. Thus, the upper exposed and patterned area abuts with the lower exposed and patterned area at the boundary line 22 in an interlocking manner according to the present invention as further discussed below.

Thus, from FIGS. 2 and 3, it is understood that a first alignment mark 36 in the top track 30 of the kerf 24 is exposed at the time of exposure of the upper chip 26. The second alignment mark 38 in the bottom track 32 of the kerf 24 is exposed at the time of exposure of the lower chip 28. The kerf 24 is thus a region which gets created between the active areas of adjacent chips on a wafer. As previously discussed, the kerf 24 is further divided into a top track 30 and a bottom track 32. The top track 30 of the kerf 24 is the bottom of field for the upper chip 26. The bottom track 32 of the kerf 24 is the top of field for the lower chip 28.

With reference again to FIG. 2, according to the present invention, the tracks 30 and 32 in the kerf 24 for the alignment marks 36 and 38 are designed in a manner as follows. The boundary line 22 in FIG. 2 represents the way in which a layout design of the alignment marks would appear on a mask pattern that is laid down for respective chips 26 and 28. There is no occurrence of one exposure being exposed directly over the same area by a second or subsequent exposure. As shown in FIG. 3, when the top track 30 is exposed, an indent region 37 is purposefully included, the indent region 37 (corresponding to a region for subsequent alignment mark 38 in bottom track 32) extending in a direction away from the kerf centerline $C_L$ towards chip 26 and proximate the edge of active area of the upper chip 26. The indent region 37 is a region that the bottom track 32 subsequently will lay upon. During exposure of a region 25, including the top track 30, the indent region 37 is basically left blank, that is, it doesn't get exposed. The indent region 37 is a part of the wafer not yet exposed, as indicated by numeral 27 of FIG. 3. The boundary line 22 thus exemplified the way that the top track 30 alignment mark design would appear on the mask pattern that is about to be laid down (i.e., exposed) during an exposure step for chip 26.

The top track and bottom track alignment marks 36 and 38, respectively, are thus designed in a manner wherein the top track 30 and bottom track 32 are in an interlocking alignment with respect to one another. In other words, the top track 30 includes cut-outs which fit together with complementary extended portions of the bottom track 32, for example, at region 37, and vice-versa. In essence, the top track 30 is analogous to a jig-saw puzzle piece which is fitted and interlocked with a complementary jig-saw puzzle piece representing the bottom track 32. Cut-out regions in the bottom track 32 abut and interlock with complementary protruding regions of the top track 30, for example, at region 35, etc. In this manner, adjacent alignment marks for different fields are arranged in a linear overlapping pattern along the kerf, reducing the width of the kerf and resulting in enlarged active chip areas relative to the kerf.

The top track 30 of the kerf 24 includes regions which are exposed during an exposure of the upper chip 26. The top track 30 includes a jig-saw type shape having first regions extending inwardly from a center line $C_L$ of the kerf 24 towards the upper chip 26 active area and second regions extending outwardly from the center line $C_L$ of the kerf 24 away from the upper chip 26 active area. The inward regions and outward regions of the top track 30 can also be spaced laterally from one another, as shown by reference numeral 40 in FIG. 2, by a desired lateral spacing amount.

Figure 6:
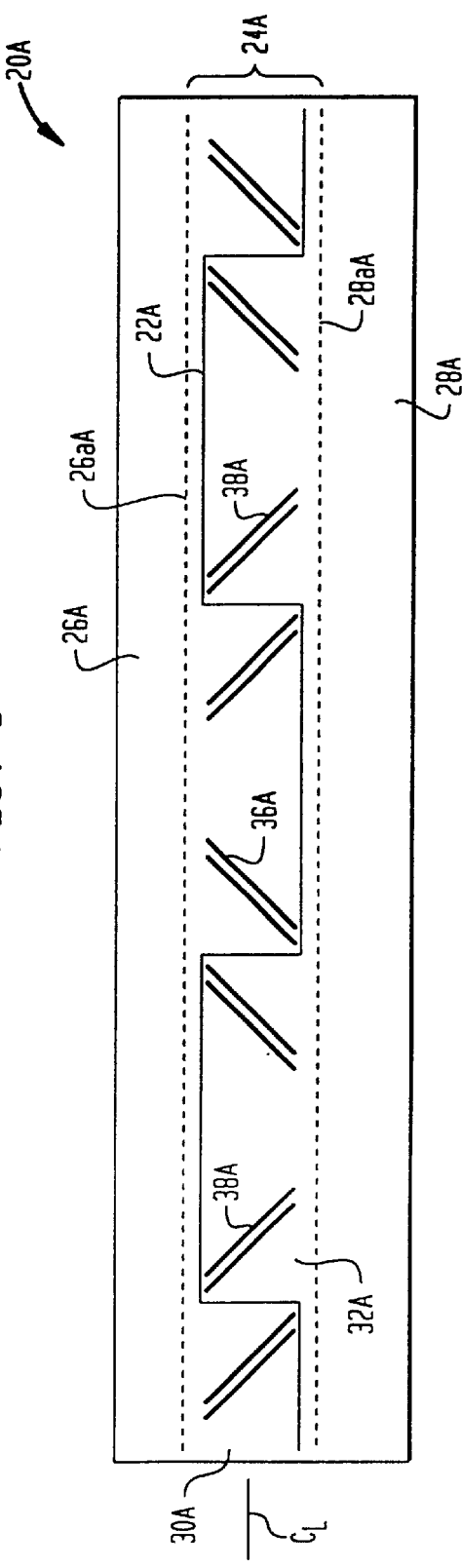
FIG. 6 is a plan view illustrating the method of arranging alignment marks in accordance with an alternate embodiment of the present invention.

Alternatively, the inward regions and outward regions can be laterally spaced side-by-side as shown for example in FIG. 6. The bottom track 32 of the kerf 24 includes a complementary and interlocking shape with respect to the top track 30. As shown in FIG. 6, the top chip 26A is formed in an active area of wafer 20A. The boundary of the active area of chip 26A is indicated by reference numeral 26aA. The bottom chip 28A is formed in an active area below chip 26A of wafer 20A. The boundary of the active area of chip 28A is indicated by reference numeral 28aA. Top and bottom tracks of kerf 24A are noted by reference numerals 30A and 32A respectively. Alignment marks 36A reside in the top track 30A and are associated with top chip 26A. Alignment marks 38A reside in the bottom track 32A and are associated with bottom chip 28A. Each track 30A, 32A includes inward regions and outward regions, extending between the kerf center line $C_L$ and a respective chip active area, which couple with complementary interlocking regions of the other track 32A, 30A, respectively. As shown in FIG. 6, the inward regions and outward regions of each track are laterally disposed side-by-side.

Referring now to either FIG. 2 or FIG. 6, viewed in another way, the top track includes regions which protrude beyond the kerf centerline $C_L$ into one or more regions of the bottom track and the bottom track includes regions which protrude beyond the kerf centerline $C_L$ into one or more regions of the top track. The protruding regions of the top track and the protruding regions of the bottom track are offset from one another by a desired lateral spacing. The protruding regions of each respective track also include respective alignment marks. The alignment marks are thus also offset from one another within the kerf, wherein the kerf height has been advantageously reduced to on the order of less than two times (2×) the height of a single alignment mark. Preferably, the kerf height is reduced to a height on the order of a single alignment mark. Note that it is the alignment marks only that are offset, and not the chips. The protruding regions, and thus the alignment marks, can be designed to occur anywhere horizontally within the kerf.

In accordance with the present invention, the kerf width is advantageously reduced on the order of fifty percent (50%) with respect to the kerf width of FIG. 1. That is, the kerf in accordance with the present invention is only half as wide as the kerf of FIG. 1. Thus, valuable semiconductor real estate which has been saved using the method of the present invention can be advantageously utilized for producing a greater number of semiconductor chips per wafer.

When referring to the kerf as a dicing channel, the width of the saw is typically smaller than the dicing channel, otherwise the saw would cut undesirably into the active area of a chip. While dicing saws have improved in a manner such that the dicing width has gotten smaller, the alignment marks used by optical alignment systems have not. The optical alignment systems require an alignment mark of a certain size. The present invention thus provides a unique solution to an improved method of arranging alignment marks in a reduced width kerf for maximizing semiconductor real estate, without compromising alignment by reducing the size of the alignment marks. The present invention provides a first alignment mark associated with the upper chip which is laterally offset from and linearly aligned with a second alignment mark associated with the lower chip, the alignment marks further intersecting a centerline of the kerf.

As such, the kerf width is now dictated by the dicing tool, not by alignment marks, maximizing active chip area relative to the kerf area attributable to each chip prior to dicing (which removes the kerf prior to packaging of the chips).

With respect to a Micrascan alignment tool, the alignment tool requires alignment marks characterized by pairs of lines. When looking for a top track (bottom of field), the alignment tool frame of reference looks for the alignment marks which include a pair of lines oriented at +45° followed by a pair of lines oriented at −45°. Likewise, when looking for a bottom track (top of field), the alignment tool looks for the alignment marks which include a pair of lines oriented at −45° followed by a pair of lines oriented at +45°. The alignment tool assimilates information in a certain order, therefore a particular ordering of the alignment marks are required for the alignment tool to operate properly. While the particular characteristics of an alignment mark are established by the particular alignment tool, the x-y location of the alignment marks within the kerf can be changed, as discussed herein with respect to the present invention.

Thus in accordance with the present invention, the kerf width has been effectively reduced to a width on the order of the height of a single alignment mark for a particular alignment system. In addition, the half-width of the kerf is required to be on the order of at least the half width of the dicing saw. As a result, the usable semiconductor real estate on the wafer (i.e. the size of the chips themselves) is increased over chips formed using prior art alignment methodologies. In other words, semiconductor real estate which is used for the kerf (i.e., for the disposable region) is effectively minimized.

In addition, if desired, information can be collected for both the top track and the bottom track in a single scan. See for example the illustration of FIG. 6. Alignment marks 36A associated with chip 26A are at a same vertical positioning as alignment marks 38A associated with chip 28A within kerf 24A. Both alignment marks 36A and 38A can be scanned during a single scan. As a result, the present invention advantageously enables a scanning of the alignment marks in the top track and the bottom track of the kerf for a top chip and a bottom chip, respectively, in fifty percent (50%) less time. The system throughput is thereby increased.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims. For example, the present invention has been described with respect to the use of top and bottom tracks of a horizontal kerf. The present invention is equally applicable for use with a left-hand track and a right-hand track of a vertical kerf.

What is claimed is:

1. A plurality of semiconductor chips having an enlarged active chip area relative to a kerf area therebetween removed prior to packaging, said kerf area having adjacent alignment marks uniquely associated with respective adjacent ones of said plurality of said semiconductor chips, the alignment marks being disposed in a linear overlapping pattern extending across a centerline of said kerf.

2. A semiconductor wafer for use in the manufacture of semiconductor devices, said wafer comprising a plurality of active chip areas and kerf region therebetween, said kerf regions comprising:

a) a first track of a kerf, the first track including at least one alignment mark region having a first alignment mark disposed therein for use in an alignment of a first field of a first semiconductor chip active area; and b) a second track of the kerf, the second track including at least one alignment mark region having a second alignment mark disposed therein for use in an alignment of a second of field of a second semiconductor chip active area, wherein the alignment mark regions of the first track and the second track are complementary and interlocking alignment mark regions extending across a centerline of the kerf and arranged in an offset manner with respect to one another along the kerf.

3. The kerf region of claim 2, wherein the first track corresponds to a top track of a horizontal kerf and the first field corresponds to a bottom of field of the first semiconductor chip active area; and the second track corresponds to a bottom track of the horizontal kerf and the second field corresponds to a top of field of the second semiconductor chip active area.

4. The kerf region of claim 2, wherein the first track corresponds to a left-hand track of a vertical kerf and the first field corresponds to a right of field of the first semiconductor chip active area, and the second track corresponds to a right-hand track of the vertical kerf and the second field corresponds to a left of field of the second semiconductor chip active area.

5. The kerf region of claim 2, wherein
the alignment mark region of said first track includes a region which extends beyond the centerline of the kerf in a direction of the second semiconductor chip active area; and
the alignment mark region of said second track includes a region which extends beyond the centerline of the kerf in a direction of the first semiconductor chip active area.

6. The kerf region of claim 2, wherein
the alignment mark regions of the first track and the second track are arranged in an offset manner with respect to one another along the kerf by a desired spacing amount.

7. The kerf region of claim 2, wherein
the alignment mark regions of the first track and the second track are arranged in an offset manner with respect to one another along the kerf in a direct side-by-side arrangement.

8. The kerf of claim 1, wherein
the kerf includes a width dimension on the order of less than two times (<2x) a width dimension of a single alignment mark.

9. The kerf of claim 1, wherein
the kerf includes a width dimension on the order of a width dimension of a single alignment mark.

10. The kerf region of claim 2, wherein
the alignment marks in the first track and the second track are aligned at a same level positioning within the kerf, further in a manner for enabling a scanning of the alignment marks in the top track and in the bottom track to occur in a single scan.

11. A semiconductor wafer having a plurality of active chip areas separated by a kerf region having a plurality of channels therein, each of said channels being associatced with an adjacaent one of said plurality of active chip areas and having one or more alignment marks therein, said kerf region having an appreciably uniform width that is approximately the same as a width of a single alignment mark formed thereon.

12. A semiconductor wafer having a plurality of active chip areas separated by a kerf region having a given width, each of said active chip areas having one or more alignment marks uniquely associated therewith and disposed such that alignment marks for adjacent chip areas are adjacent one another in said kerf region, each of said alignment marks having a width substantially similar to said width of said kerf region.

* * * * *